(12) United States Patent
Klumperink et al.

(10) Patent No.: US 12,081,170 B2
(45) Date of Patent: Sep. 3, 2024

(54) RADIO FREQUENCY RECEIVER AND METHOD FOR DOWN-CONVERTING SIGNALS TO BASEBAND SIGNAL COMPONENTS

(71) Applicant: Stichting IMEC Nederland, Eindhoven (NL)

(72) Inventors: Eric Antonius Maria Klumperink, Lichtenvoorde (NL); Vijaya Kumar Purushothaman, Enschede (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 104 days.

(21) Appl. No.: 17/431,251

(22) PCT Filed: May 31, 2019

(86) PCT No.: PCT/EP2019/064182
§ 371 (c)(1),
(2) Date: Aug. 16, 2021

(87) PCT Pub. No.: WO2020/239233
PCT Pub. Date: Dec. 3, 2020

(65) Prior Publication Data
US 2022/0131500 A1 Apr. 28, 2022

(51) Int. Cl.
*H03D 7/14* (2006.01)
*H04B 1/16* (2006.01)

(52) U.S. Cl.
CPC ............ *H03D 7/1441* (2013.01); *H04B 1/16* (2013.01)

(58) Field of Classification Search
CPC .... H03D 7/1441; H03D 1/2227; H03D 7/165; H04B 1/16
See application file for complete search history.

(56) References Cited

U.S. PATENT DOCUMENTS

| | | | |
|---|---|---|---|
| 9,692,471 B2 | 6/2017 | Lien et al. | |
| 2003/0083033 A1* | 5/2003 | Staszewski | H03D 7/125 455/313 |
| 2007/0142019 A1* | 6/2007 | Mattisson | H03D 7/165 455/327 |
| 2008/0139149 A1 | 6/2008 | Mu et al. | |
| 2010/0041361 A1 | 2/2010 | Ojo | |
| 2016/0211873 A1* | 7/2016 | Lien | H04B 1/06 |

OTHER PUBLICATIONS

PCT International Search Report and Written Opinion, Application No. PCT/EP2019/064182, mailed Mar. 5, 2020, 10 pages.

* cited by examiner

*Primary Examiner* — Yuwen Pan
*Assistant Examiner* — Fatuma G Sherif
(74) *Attorney, Agent, or Firm* — McDonnell Boehnen Hulbert & Berghoff LLP (57) ABSTRACT

A radio frequency receiver comprising mixer circuitry to down-convert a received signal, which is transported on a signal line to baseband signal components, is provided. The mixer circuitry comprises a plurality of switched capacitors, each connected to the signal line through a signal side node and to a corresponding switch through a switch side node. In this context, a voltage is sensed at each switch side node of the plurality of switched capacitors and is read out through a respective grounded capacitor.

20 Claims, 8 Drawing Sheets

RADIO FREQUENCY RECEIVER AND METHOD FOR DOWN-CONVERTING SIGNALS TO BASEBAND SIGNAL COMPONENTS

CROSS-REFERENCE TO RELATED APPLICATIONS

This application claims the benefit under 35 U.S.C. § 371 of the filing date of International Patent Application No. PCT/EP2019/064182, having an international filing date of May 31, 2019, the content of which is incorporated herein by reference in its entirety.

FIELD OF THE DISCLOSURE

This application relates to a radio frequency receiver and a corresponding method to down-convert a received signal to baseband signal components, such as a mixer-first receiver construction, which omits a low noise amplifier before the mixer.

BACKGROUND

In order to realize a highly linear band-selective electronic receiver for data communication purposes in Complementary Metal-Oxide Semiconductor (CMOS) integrated circuit technology, mixer-first receivers have been proposed, which omit a low noise amplifier before the mixer, but rather put the mixer first. A passive mixer-first receiver comprising switched R-C circuits can provide both frequency conversion and narrow-band high-Q filtering with a center frequency that is controlled by the switching frequency. Generally, such a passive mixer-first receiver comprises N number of switched R-C signal paths that are driven by non-overlapping clocks with the same frequency but with different phases, separated by 360/N degrees.

Figures 1A, 1B:
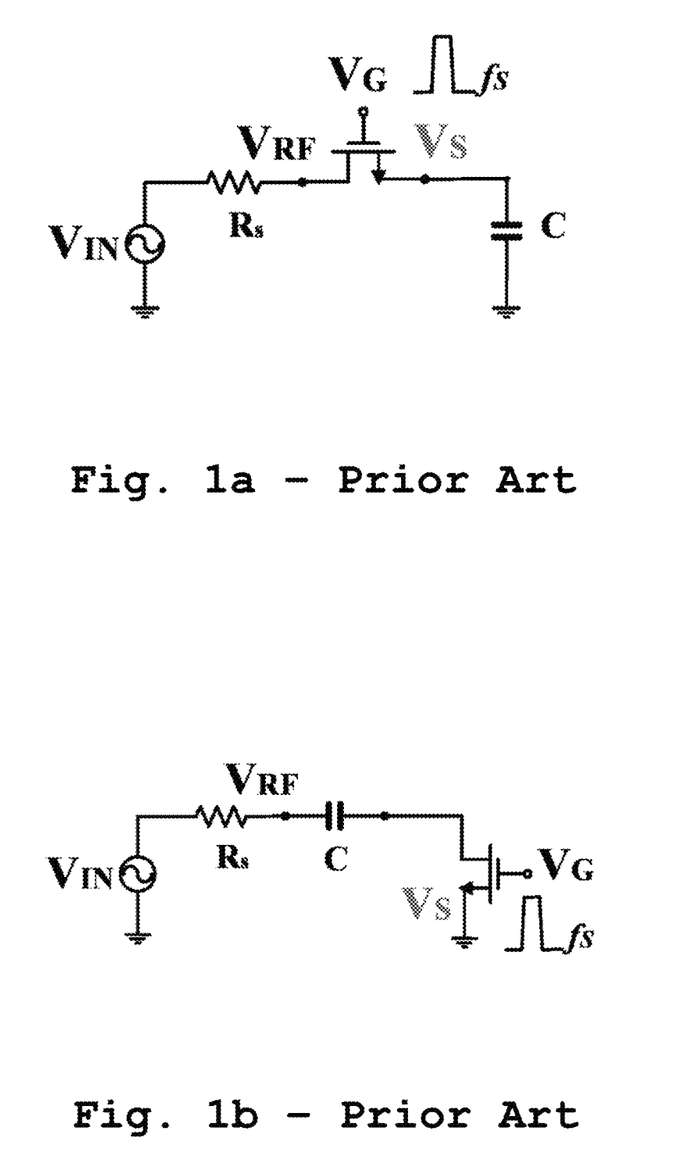
FIG. 1a shows a top-plate mixing technique for switched R-C mixing path.
FIG. 1b shows a bottom-plate mixing technique for switched R-C mixing path.

The switched R-C circuits with Metal-Oxide-Semiconductor Field-Effect Transistor (MOSFET) switches in N-path mixers exploit the condition that the voltage on the capacitors becomes virtually constant for an input frequency close to the switching frequency by assuming RC time constants much larger than the on-time of the switches. FIG. 1a illustrates a technique for top-plate mixing where $V_{IN}$ is the amplitude of the antenna signal, and a switch is placed between the antenna signal node $V_{RF}$ and the top plate of a grounded capacitor C. The baseband signal is stored in the grounded capacitor C and is read out during the time when the switch is open and the antenna signal $V_{IN}$ is no longer directly affecting the capacitor voltage. However, the MOSFET switch suffers from the modulation of channel resistance, which significantly limits its linearity.

FIG. 1b illustrates a technique for bottom-plate mixing where the antenna signal node $V_{RF}$ is connected to the top plate of the capacitor C, and the bottom plate is switched to ground. In this case, the capacitor C remains always connected to the antenna signal $V_{IN}$ and thereby, the antenna signal $V_{IN}$ and the baseband signal both affect the capacitor voltage. By avoiding modulation of the source voltage of the MOSFET, the channel resistance-induced distortion is effectively reduced and therefore, the bottom-plate mixing technique achieves superior linearity compared to the top-plate mixing technique. However, the bottom-plate mixing technique introduces a baseband signal read-out problem since the baseband signal is no longer available on a grounded capacitor as described above. When the switch is open, the capacitor C becomes floating and stores the down-converted baseband voltage across its terminal without being referenced to ground. Conventionally, a readout of the baseband signal is performed in the current domain using resistors that perform V-I conversion. However, such a method for reading out the baseband signal in a bottom-plate mixing configuration introduces gain loss and additional noise.

Figure 2:
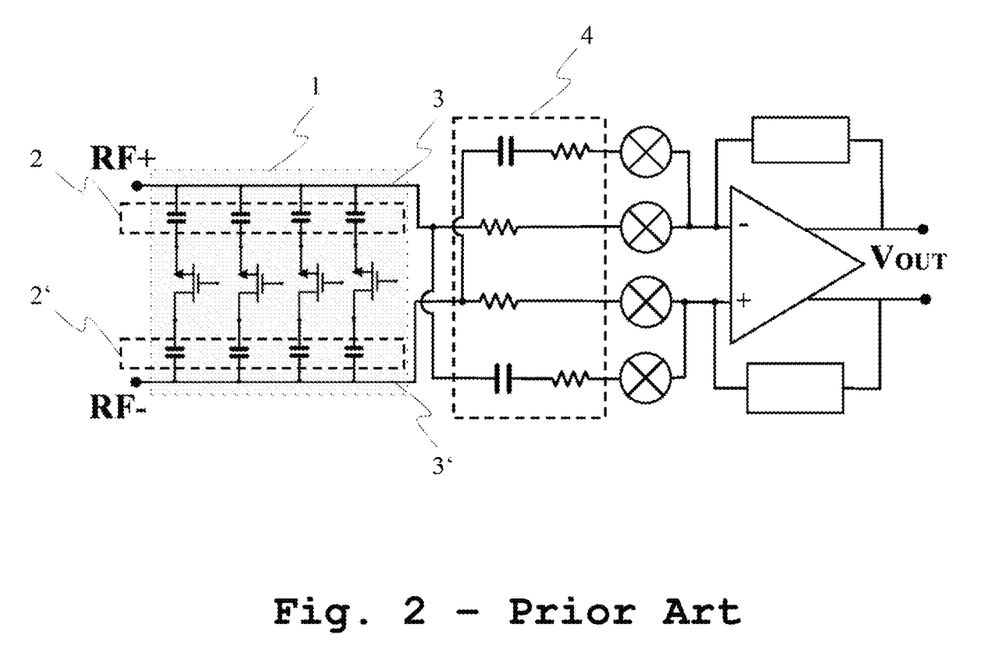
FIG. 2 shows a wireless receiver using bottom-plate configuration according to the prior art.

For example, U.S. Pat. No. 9,692,471 B2 discloses a wireless receiver with a bottom-plate configuration, having an out-band signal bypass filter, a mixer, and a baseband circuit. The out-band signal bypass filter provides an out-band signal bypass path from where the mixer receives a filtered signal. The baseband circuit is coupled to the mixer for generation of an in-phase signal and a quadrature-phase signal. As illustrated in FIG. 2, the bottom-plate configuration 1 is simply used as a band-pass filter since the bottom-plate configuration 1 complicates the possibility of extracting the baseband signal from the capacitors 2, 2'. The RF voltage 3, 3' from the top-plate of the capacitors 2, 2' is down-converted using a cross-coupled switch R-C network 4.

SUMMARY

Disclosed herein are a radio frequency receiver and a method to down-convert a received signal to baseband signal components, such as for a mixer-first receiver construction that utilizes bottom-plate mixing technique to achieve high linearity without requiring additional V-I conversion.

According to a first aspect, a radio frequency receiver comprising a mixer circuitry to down-convert a received signal, which is transported on a signal line to baseband signal components, is provided. The mixer circuitry comprises a plurality of switched capacitors, each connected to the signal line through a signal side node and to a corresponding switch through a switch side node. A voltage is sensed at each switch side node of the plurality of switched capacitors and is read out through a respective grounded capacitor. In this context, the voltages at the switch side nodes of the plurality of switched capacitors correspond to baseband signal components. Close to the local oscillator frequency, the signal contributions on two switched capacitors with 180-degree phase difference have approximately equal but opposite amplitudes, and hence the capacitor voltages are intrinsically added. Therefore, reading out the baseband signal is performed by directly sensing the voltage at the bottom plate of the switched capacitors, which eliminates the necessity for additional V-I conversion.

According to a first implementation form of the first aspect, the mixer circuitry comprises an even number of mixing paths, each comprising at least one of the plurality of switched capacitors. This facilitates achieving circuital symmetry.

According to a second implementation form of the first aspect, the mixer circuitry further comprises a plurality of read-out switches coupled between each of the switch side nodes and the respective grounded capacitor. In addition, each grounded capacitor can be reused for reading out voltages from different switch side nodes via the plurality of read-out switches.

According to a further implementation form of the first aspect, the radio frequency receiver further comprises a clock generating circuitry to generate non-overlapping clocks, such as at least four-phase non-overlapping clocks to drive the plurality of switched capacitors and the plurality of read-out switches. A higher order phase of non-overlapping clocks, for instance, eight-phase or twelve-phase non-overlapping clocks, can be implemented if harmonic rejection mixing is targeted. Four-phase non-overlapping clock generation is useful for I/Q generation. However, eight-phase non-overlapping clock generation might also be useful as it reduces conversion loss, and a corresponding eight signal read-out may facilitate harmonic rejection. Synchronous switching is achieved for the switched capacitors as well as for the read-out switches.

According to a further implementation form of the first aspect, the switched capacitors are driven in rotation such that at a given clock phase, at least two switched capacitors are out of phase to each other and are connected in series. Since the mixer circuitry comprises an even number of mixing paths, there are at least two mixing paths that are out of phase to each other for any given clock phase. Furthermore, considering the fact that a series connection of two capacitor voltages allows for subtracting voltage signals, the two anti-phase signals corresponding to the out of phase mixing paths lead the series capacitor subtraction to addition of the amplitudes, thereby doubling the amplitude of the sensed voltage at a given switched capacitor. Therefore, a doubling of voltage gain is achieved for the baseband signal.

According to a further implementation form of the first aspect, the radio frequency receiver further comprises an input circuitry configured to transform the received signal into a differential signal having a positive and a negative partial signal. A fully differential configuration is realized with balanced radio frequency input voltages having an equal amplitude with a 180-degree phase shift.

According to a further implementation form of the first aspect, the input circuitry further comprises an impedance matching network, such as a low-loss LC network. The low-loss LC network also provides additional filtering of high-frequency folding products.

According to a further implementation form of the first aspect, the mixer circuitry further comprises bias switches to set a common-mode bias voltage of the mixer circuitry and the plurality of read-out switches through an external supply. Therefore, sufficient DC offset voltage is provided to turn on the switches and to be biased in the active region.

According to a further implementation form of the first aspect, the radio frequency receiver further comprises output circuitry coupled to the mixer circuitry to output the baseband signal components. The output circuitry, in an example, comprises differential amplification circuitry to amplify the difference between two input voltages but suppresses any voltage common to the two inputs such that the output is proportional to the difference between the two inputs.

According to a further implementation form of the first aspect, the radio frequency receiver further comprises an antenna for receiving radio frequency signals. Additionally or alternatively, the radio frequency receiver comprises radio frequency connectors to receive radio frequency signals via wires.

According to a second aspect, a method for down-converting a received signal, which is transported on a signal line to baseband signal components in a radio frequency receiver, is provided. The method comprises connecting each of a plurality of switched capacitors to the signal line through a signal side node, connecting each of the plurality of switched capacitors to a corresponding switch through a switch side node, and sensing a voltage at each switch side node of the plurality of switched capacitors and reading it out through a respective grounded capacitor. As a result, reading out the baseband signal is performed by directly sensing the voltage at the bottom plate of the switched capacitors, which eliminates the necessity for additional V-I conversion.

According to a first implementation form of the second aspect, the method further comprises arranging an even number of mixing paths, each comprising at least one of the plurality of switched capacitors. This facilitates achieving circuital symmetry.

According to a second implementation form of the second aspect, the method further comprises driving the switched capacitors in rotation such that at a given clock phase, at least two switched capacitors are out of phase with each other and are connected in series. Since the mixer circuitry comprises an even number of mixing paths, there are at least two mixing paths that are out of phase with each other for any given clock phase. Furthermore, considering the fact that a series connection of two capacitor voltages allows for subtracting voltage signals, the two anti-phase signals corresponding to the out of phase mixing paths lead the series capacitor subtraction to addition of the amplitudes and thereby doubling the amplitude of the sensed voltage at a given switched capacitor. Therefore, a doubling of voltage gain is achieved for the baseband signal.

BRIEF DESCRIPTION OF THE FIGURES

The above, as well as additional features, will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

FIG. 1a, FIG. 1b and FIG. 2 have already been described above.

Figure 3:
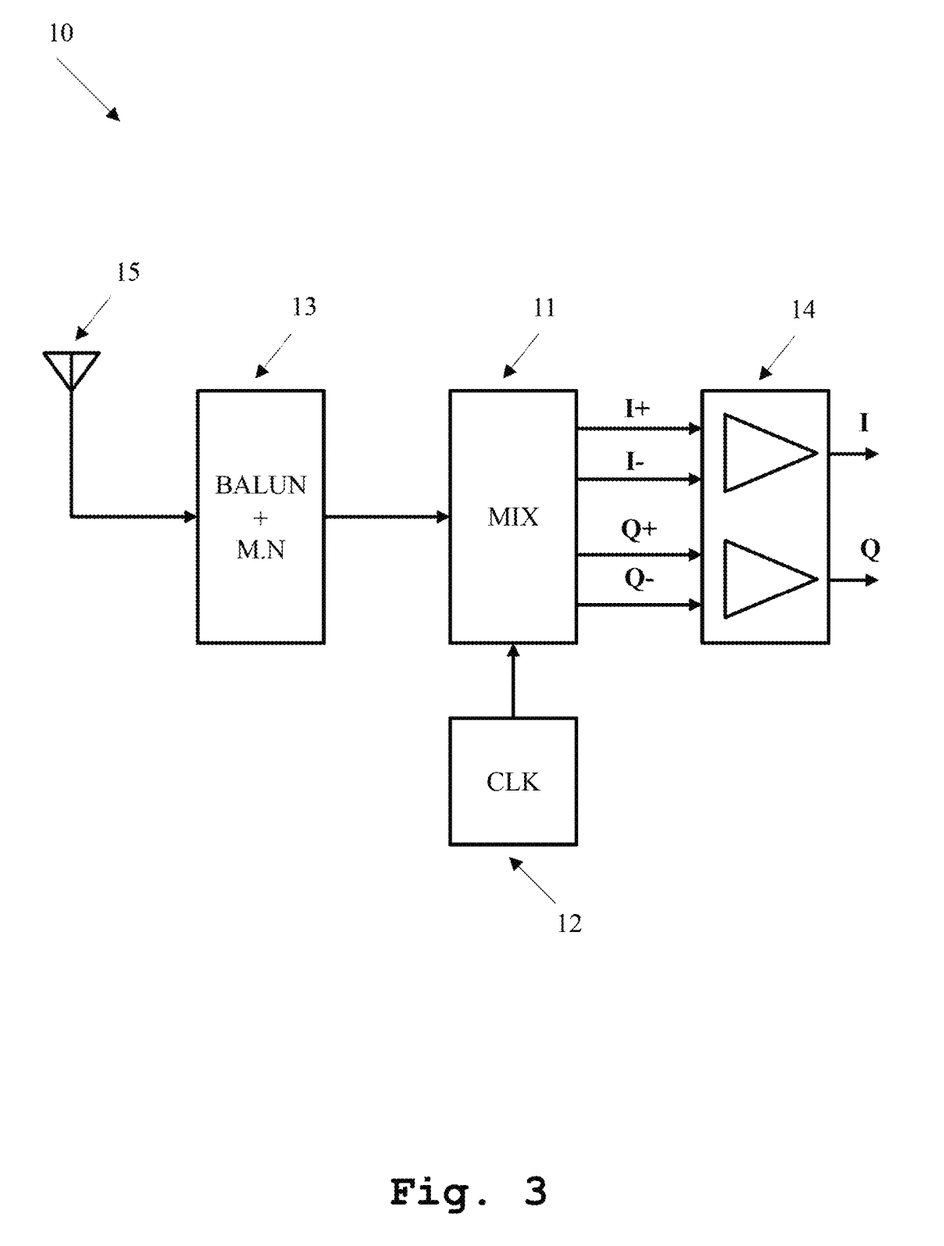
FIG. 3 shows a block diagram of the radio frequency receiver, according to an example of the first aspect.

FIG. 3 illustrates a block diagram of the radio frequency receiver 10 according to the first aspect. The radio frequency receiver comprises mixer circuitry 11, clock generating circuitry 12, input circuitry 13, output circuitry 14, and an antenna 15. The input circuitry 13 receives a radio frequency signal through the antenna 15 and transforms the received radio frequency signal into a differential signal having a positive partial signal RF+ and a negative partial signal RF−, which are not shown in FIG. 3. In this context, the antenna 15 can be generalized as a radio frequency signal source with a series source resistance. The transformation of the received signal into the differential signal can be achieved via, for example, a balanced to unbalanced radio frequency transformer (Balun) with a preferable turns ratio.

The input circuitry 13 might further comprise a low-loss LC network to perform impedance matching at the input side that is coupled to the mixer circuitry 11. The functionalities and constructions of a Balun and an LC impedance matching network are known in the art. Therefore, these circuits are not described herein in greater detail. Instead of receiving radio frequency signals through the antenna 15, the input circuitry 13 may comprise radio frequency connectors to receive signals via, for example, coaxial cables.

The clock generating circuitry 12 comprises, for instance, frequency divider circuitry, for example, a modulo counter to provide non-overlapping clocks. The number of clock phases and the duty cycle depend on the number of mixing paths utilized in the mixer circuitry 11. In the following embodiments, four-phase non-overlapping clocks are illustrated with a 25% duty cycle that are generated by a divide-by-2 circuit. However, the claims are not limited to only this arrangement and any divide-by circuit of N order with a different duty cycle or other circuitry to generate multi-phase clocks is considered to fall within the scope of the claims.

The mixer circuitry 11 performs modulation of the differential radio frequency signal, and with respect to the clock phases that drive the mixing paths, the differential in-phase baseband signal components I+, I− and the differential quadrature baseband signal components Q+, Q− are fed to the output circuitry 14 that is coupled to the mixer circuitry 11. The output circuitry 14 performs differential amplification such that the output is proportional to the difference between the two inputs. The output circuitry 14 outputs the in-phase baseband signal component I and the quadrature baseband signal component Q.

Figure 4:
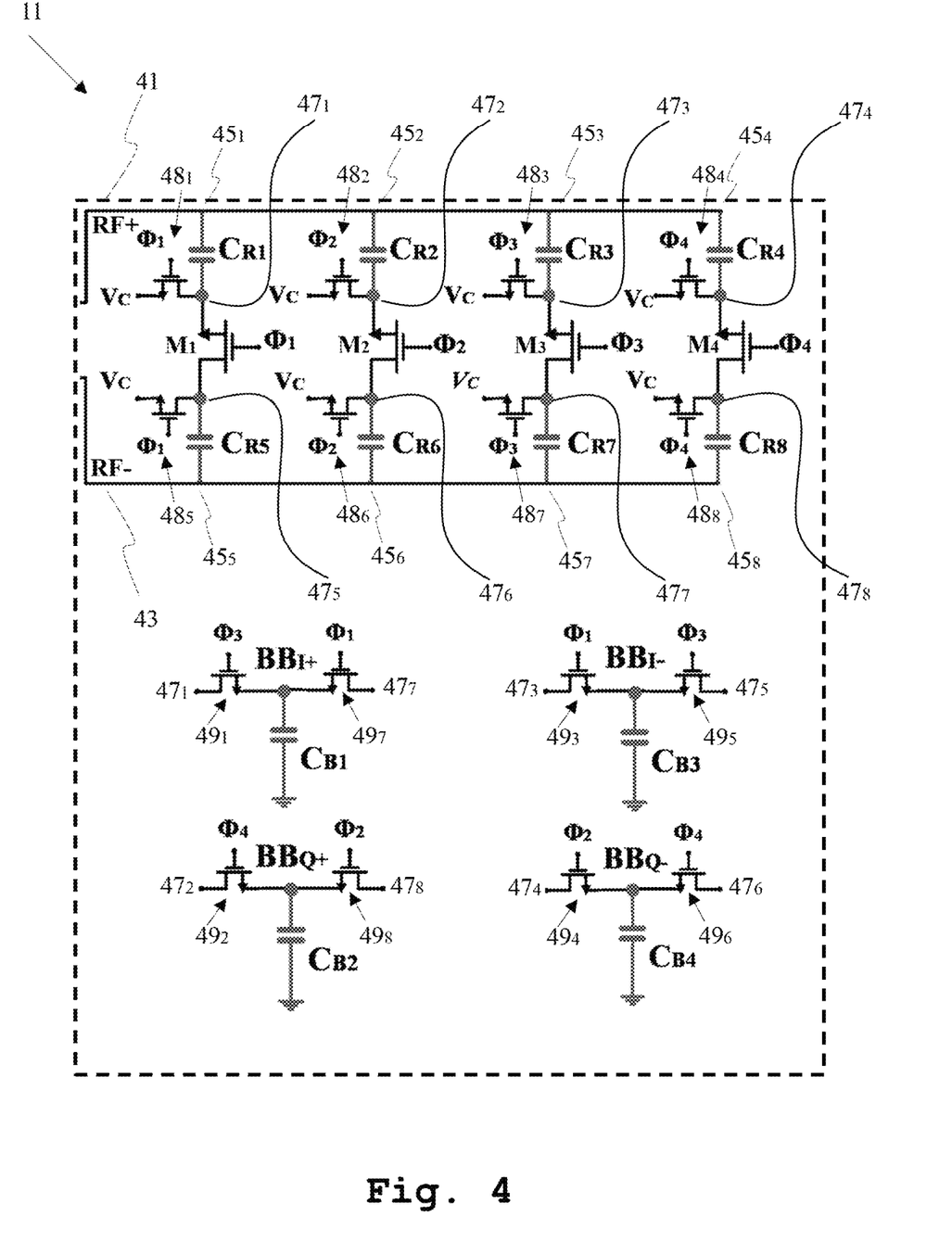
FIG. 4 shows a first embodiment of the mixer circuitry, according to an example of the first aspect.

FIG. 4 illustrates a first example embodiment of the mixer circuitry according to the first aspect. The differential signal from the input circuitry 13 is transported on the signal lines 41, 43 of the mixer circuitry 11. Herein, the mixer circuitry 11 comprises four mixing paths. However, it is clear that any lower or higher number of mixing paths can be used. Although, having mixer circuitry 11 that comprises an even number of mixing paths does provide at least two mixing paths which are out of phase during a given clock phase.

In this embodiment, the mixer circuitry 11 comprises a plurality of switched capacitors $C_{R1}$, $C_{R2}$, $C_{R3}$, $C_{R4}$, $C_{R5}$, $C_{R6}$, $C_{R7}$, $C_{R8}$ that comprise a respective signal side node $45_1$, $45_2$, $45_3$, $45_4$, $45_5$, $45_6$, $45_7$, $45_8$ and a respective switch side node $47_1$, $47_2$, $47_3$, $47_4$, $47_5$, $47_6$, $47_7$, $47_8$. Each of the signal side nodes $45_1$-$45_8$ is connected to corresponding signal lines 41, 43 that comprise the positive partial signal and the negative partial signal RF+, RF−. Particularly, the signal side nodes $45_1$-$45_4$ are connected to the signal line 41 that transports the positive partial signal RF+ and the signal side nodes $45_5$-$45_8$ are connected to the signal line 43 that transports the negative partial signal RF−.

In this embodiment, each pair of the switched side nodes $47_1$-$47_8$ is differentially connected to each other through a respective switch $M_1$, $M_2$, $M_3$, $M_4$. Particularly, node $47_1$ is differentially connected to node $47_5$ through the switch $M_1$, node $47_2$ is differentially connected to node $47_6$ through the switch $M_2$, node $47_3$ is differentially connected to node $47_7$ through the switch $M_3$, and node $47_4$ is differentially connected to node $47_8$ through the switch $M_4$. Hence, the total number of switched capacitors $C_{R1}$-$C_{R8}$ depends on the number of mixing paths as well as on the differential configuration of the mixer circuitry 11.

The mixer circuitry 11 further comprises grounded capacitors $C_{B1}$, $C_{B2}$, $C_{B3}$, $C_{B4}$, which correspond to each of the differential in-phase and quadrature baseband signal components. The grounded capacitors $C_{B1}$-$C_{B4}$ are alternatively connected to each switch side node $47_1$-$47_8$ through read-out switches $49_1$, $49_2$, $49_3$, $49_4$, $49_5$, $49_6$, $49_7$, $49_8$. To facilitate a clear understanding of the operation, the grounded capacitors $C_{B1}$-$C_{B4}$ along with the read-out switches $49_1$-$49_8$ are drawn separately, where similar node references are maintained to translate an electrical connection. The read-out switches $49_1$-$49_8$ are switched with respect to the clock phases, and the corresponding differential baseband component is stored in the respective grounded capacitor $C_{B1}$-$C_{B4}$. For example, the grounded capacitor $C_{B1}$ is used to read out the baseband signal component at the switch side node $47_7$ of the switched capacitor $C_{R7}$ through the read-out switch $49_7$ during the clock phase $\Phi_1$. The same grounded capacitor $C_{B1}$ is re-used to read out the baseband signal component at the switch side node $47_1$ of the switched capacitor $C_{R1}$ through the read-out switch $49_1$ during the clock phase $\Phi_3$.

The mixer circuitry 11 further comprises bias switches 481, 482, 483, 484, 485, 486, 487, 488 to periodically set a common-mode bias voltage Vc of the mixer circuitry 11 and the plurality of read-out switches $49_1$-$49_8$ through an external supply that is not shown in FIG. 4.

Figure 5A:
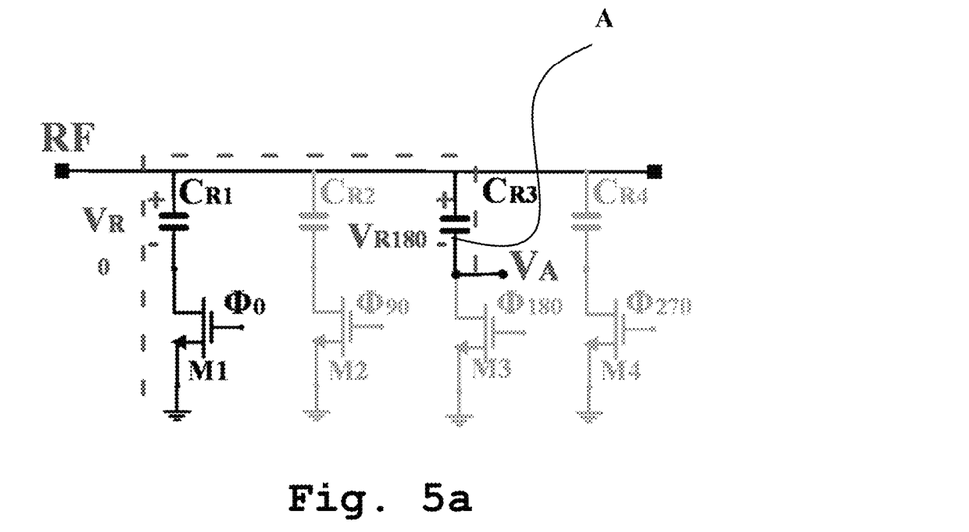
FIG. 5a shows the read-out technique for a single-ended configuration at a clock phase of 0 degrees, according to example embodiments.
Figure 5B:
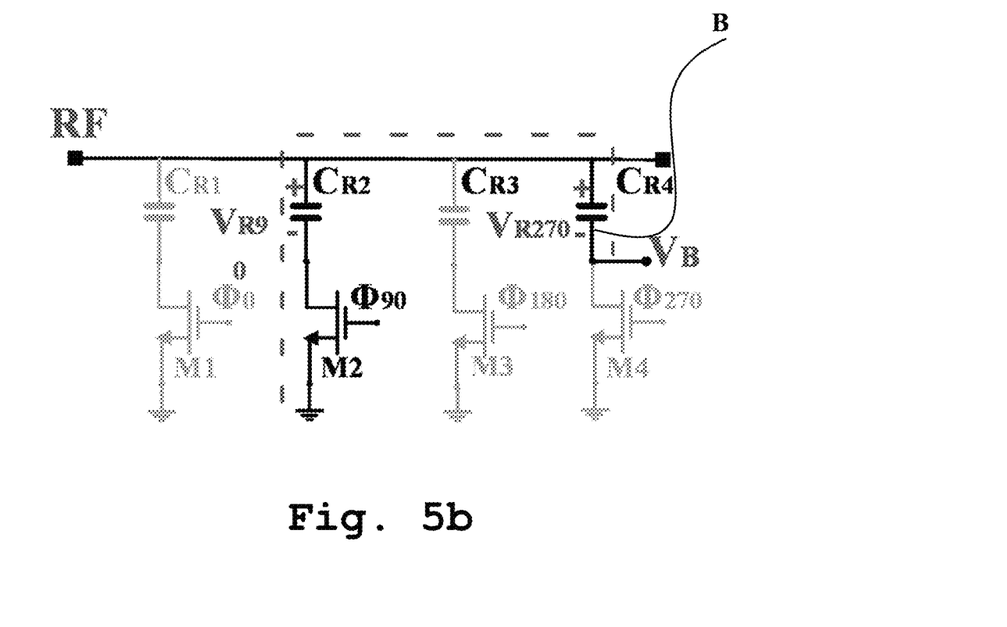
FIG. 5b shows the read-out technique for a single-ended configuration at a clock phase of 90 degrees, according to example embodiments.

Referring to FIG. 5a and FIG. 5b, the baseband signal component read-out technique in a single-ended configuration is illustrated in greater detail. A four-path single-ended mixer with a bottom plate configuration is shown where the input radio frequency signal RF is down-converted to baseband signal components by clocks $\Phi_0$, $\Phi_{90}$, $\Phi_{180}$, and $\Phi_{270}$ operating at phases 0, 90, 180, and 270 degrees on the switches $M_1$, $M_2$, $M_3$, and $M_4$ respectively. It is assumed that the down-converted baseband voltages across the switched capacitors $C_{R1}$-$C_{R4}$ are $V_{R0}$, $V_{R90}$, $V_{R180}$, and $V_{R270}$, respectively.

In FIG. 5a, read-out of the baseband voltage is performed at the clock phase $\Phi_0$. The baseband voltages $V_{R0}$ and $V_{R180}$ are in anti-phase since the clock phases $\Phi_0$ and $\Phi_{180}$ that are driving their corresponding switches $M_1$ and $M_3$ are 180 degrees phase-shifted. Therefore, the in-band instantaneous voltages can be expressed as:

$$V_{R0} = -V_{R180}$$

When switch $M_1$ is conducting, the bottom-plate of the capacitor $C_{R1}$ is connected to ground, and the other capacitors $C_{R2}$, $C_{R3}$, $C_{R4}$ remain floating. When sensing from node A, the capacitors $C_{R3}$ and $C_{R1}$ are connected in series to ground. Therefore, the resultant voltage at node A is:

$$V_A = -V_{R180} + V_{R0} = 2 \times V_{R0}$$

As a result, a voltage gain of two is achieved for baseband signals by simply sensing the voltage from the node A.

In FIG. 5b, read-out of the baseband voltage is performed at the clock phase $\Phi_{90}$. The baseband voltages $V_{R90}$ and $V_{R270}$ are in anti-phase since the clock phases $\Phi_{90}$ and $\Phi_{270}$ that are driving their corresponding switches $M_2$ and $M_4$ are 180 degrees phase-shifted. Therefore, the in-band instantaneous voltages can be expressed as:

$$V_{R90} = -V_{R270}$$

When switch $M_2$ is conducting, the bottom-plate of the capacitor $C_{R2}$ is connected to ground, and the other capacitors $C_{R1}$, $C_{R3}$, $C_{R4}$ remain floating. When sensing from node B, the capacitors $C_{R2}$ and $C_{R4}$ are connected in series to ground. Therefore, the resultant voltage at node B is:

$$V_B = -V_{R270} + V_{R90} = 2 \times V_{R90}$$

As a result, a voltage gain of two is achieved for baseband signals by simply sensing the voltage from the node B.

Figure 6A:
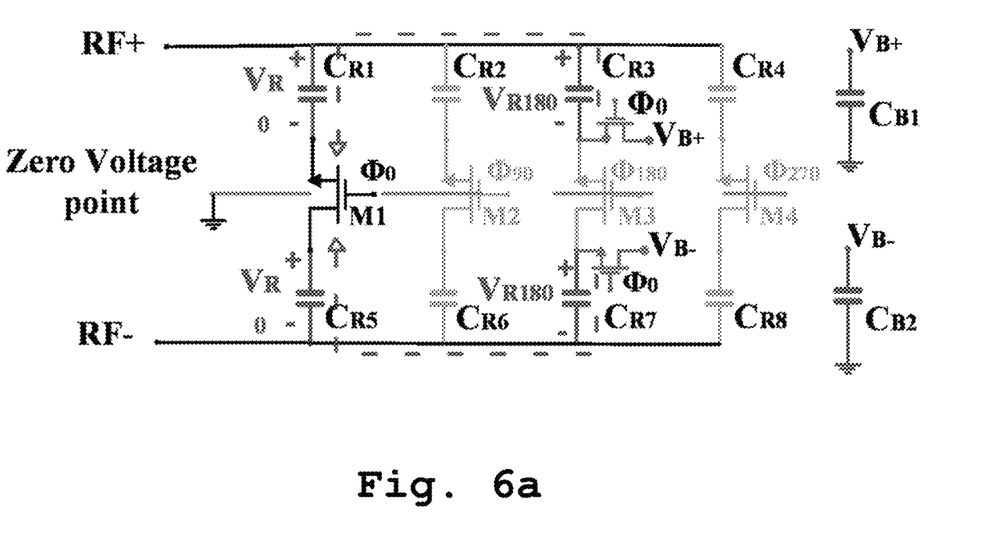
FIG. 6a shows the read-out technique for a fully differential configuration at a phase of 0 degrees, according to example embodiments.
Figure 6B:
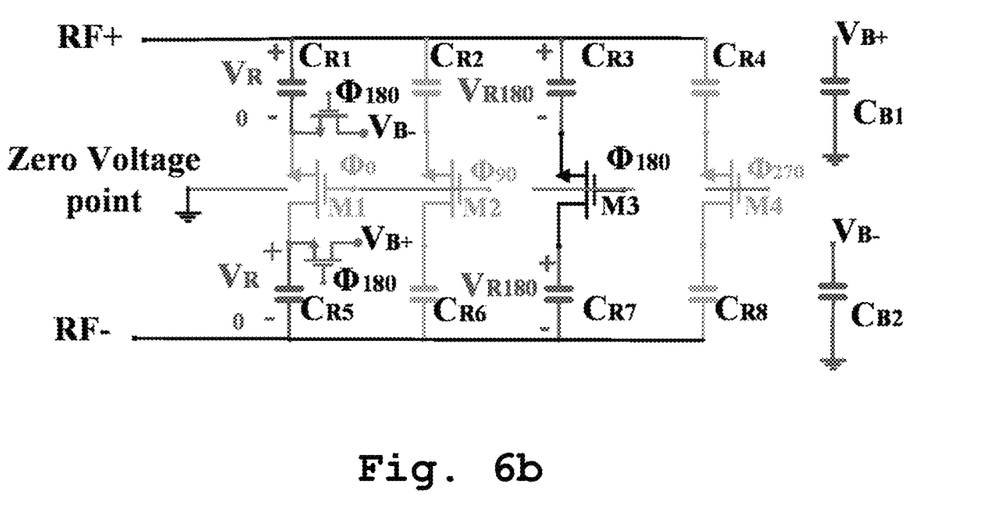
FIG. 6b shows the read-out technique for a fully differential configuration at a phase of 180 degrees, according to example embodiments.

Referring to FIG. 6a and FIG. 6b, the baseband signal component read-out technique in a fully differential configuration is illustrated in greater detail. A four-path fully differential mixer with bottom plate configuration is shown where the balanced radio frequency input signals RF+, RF− are down-converted to baseband signal components by clocks $\Phi_0$, $\Phi_{90}$, $\Phi_{180}$, and $\Phi_{270}$ operating at phases 0, 90, 180, and 270 degrees on the switches $M_1$, $M_2$, $M_3$, and $M_4$ respectively. The balanced differential inputs RF+, RF− result in a zero voltage point that occurs in the middle of the inversion region in the channel when a switch $M_1$-$M_4$ is closed. It is assumed that the down-converted baseband voltage across the switched capacitors $C_{R1}$-$C_{R4}$ is $V_{R0}$, $V_{R90}$, $V_{R180}$, and $V_{R270}$, respectively. Likewise, the down-converted baseband voltages across the switched capacitors $C_{R5}$-$C_{R8}$ are assumed to be $-V_{R0}$, $-V_{R90}$, $-V_{R180}$, and $-V_{R270}$, respectively.

In FIG. 6a, read-out of the baseband voltage is performed at the clock phase $\Phi_0$. The baseband voltages $V_{R0}$ and $V_{R180}$ are in anti-phase since the clock phases $\Phi_0$ and $\Phi_{180}$ that are driving their corresponding switches $M_1$ and $M_3$ are 180 degrees phase-shifted. When $M_1$ is conducting, the positive portion of the baseband signal components can be sensed at the bottom-plate of the switched capacitor $C_{R3}$, and the negative portion of the baseband signal component can be sensed at the bottom-plate of the switched capacitor $C_{R7}$. Since the zero voltage point behaves similar to ground in the single-ended configuration, the resulting positive baseband signal component $V_{B+}$ as well as the resulting negative baseband signal component $V_{B-}$ correspond to a double voltage gain of the respective positive and negative baseband signal components, as shown in FIG. 5a. The additional read-out capacitors $C_{B1}$ and $C_{B2}$ are used to read out the respective baseband signal components $V_{B+}$, $V_{B-}$.

In FIG. 6b, the additional read-out capacitors $C_{B1}$, $C_{B2}$ are re-used at the clock phase $\Phi_{180}$. When $M_3$ is conducting, the positive portion of the baseband signal components can be sensed at the bottom-plate of the switched capacitor $C_{R5}$, and the negative portion of the baseband signal component can be sensed at the bottom-plate of the switched capacitor $C_{R1}$. Since the input signal is fully differential and 180-degree phase shifted clocks are driving the switches $M_1$ and $M_3$, the read-out capacitors $C_{B1}$, $C_{B2}$ are effectively re-used to read-out the respective baseband signal components $V_{B+}$, $V_{B-}$. Furthermore, an additional order of infinite impulse response filtering is achieved in this technique since the read-out capacitors $C_{B1}$, $C_{B2}$ share the charges with two switched capacitors $C_{R1}$, $C_{R3}$ resp. $C_{R5}$, $C_{R7}$ at different time instants.

Figure 7:
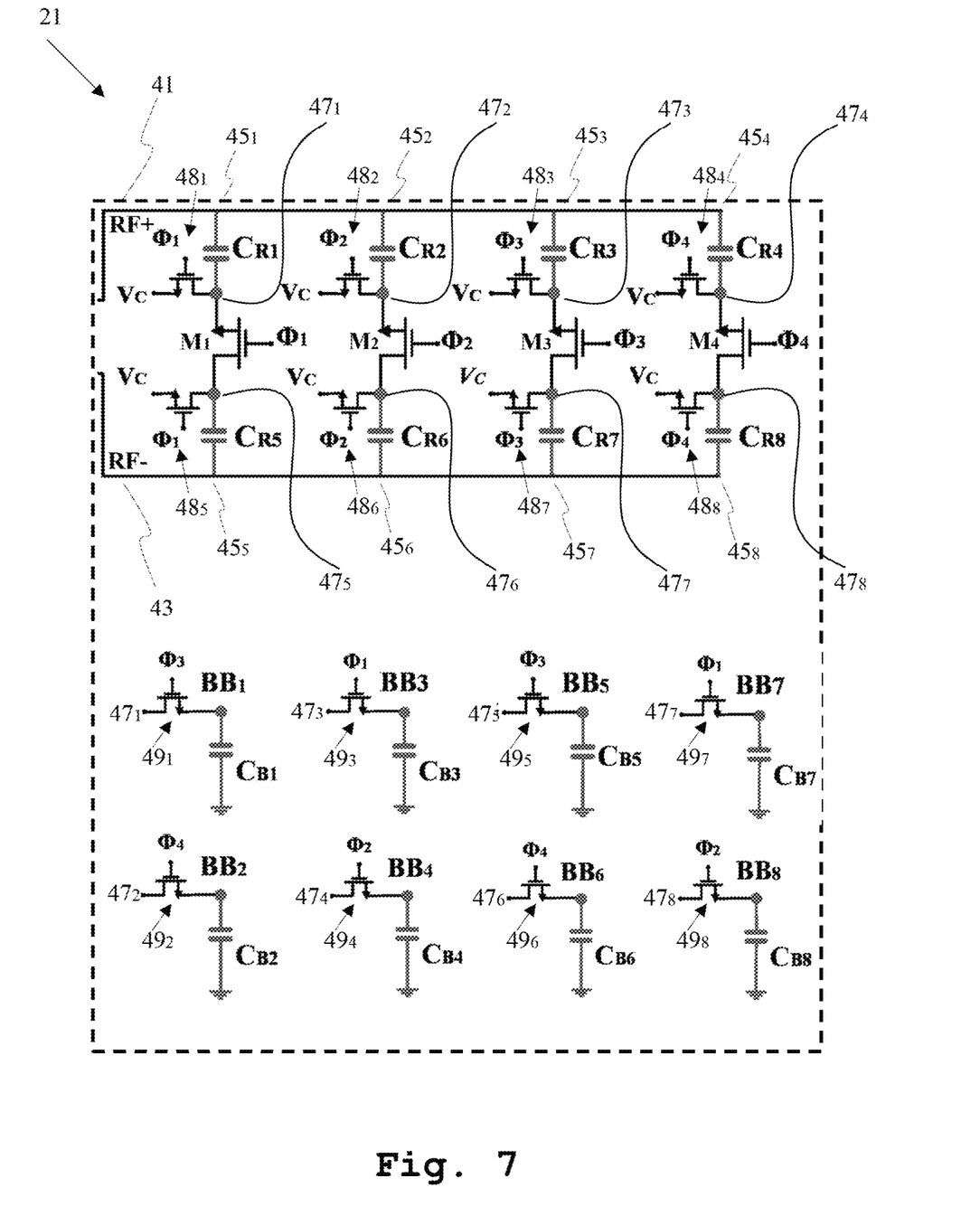
FIG. 7 shows a second embodiment of the mixer circuitry, according to an example of the first aspect.

FIG. 7 illustrates a second example embodiment of the mixer circuitry 21 according to the first aspect. The second example embodiment of the mixer circuitry 21 differs from the first example embodiment of the mixer circuitry 11 according to FIG. 4 in that the grounded capacitors $C_{B1}$, $C_{B2}$, $C_{B3}$, $C_{B4}$, $C_{B5}$, $C_{B6}$, $C_{B7}$, $C_{B8}$ are not re-used and each of the grounded capacitors $C_{B1}$-$C_{B8}$ is dedicated to a corresponding switch side node $47_1$-$47_8$ through the plurality of read-out switches $49_1$-$49_8$. Such a configuration of reading out the baseband signal components through dedicated grounded capacitors $C_{B1}$-$C_{B8}$ facilitates direct digital conversion of the baseband signal components.

Figure 8:
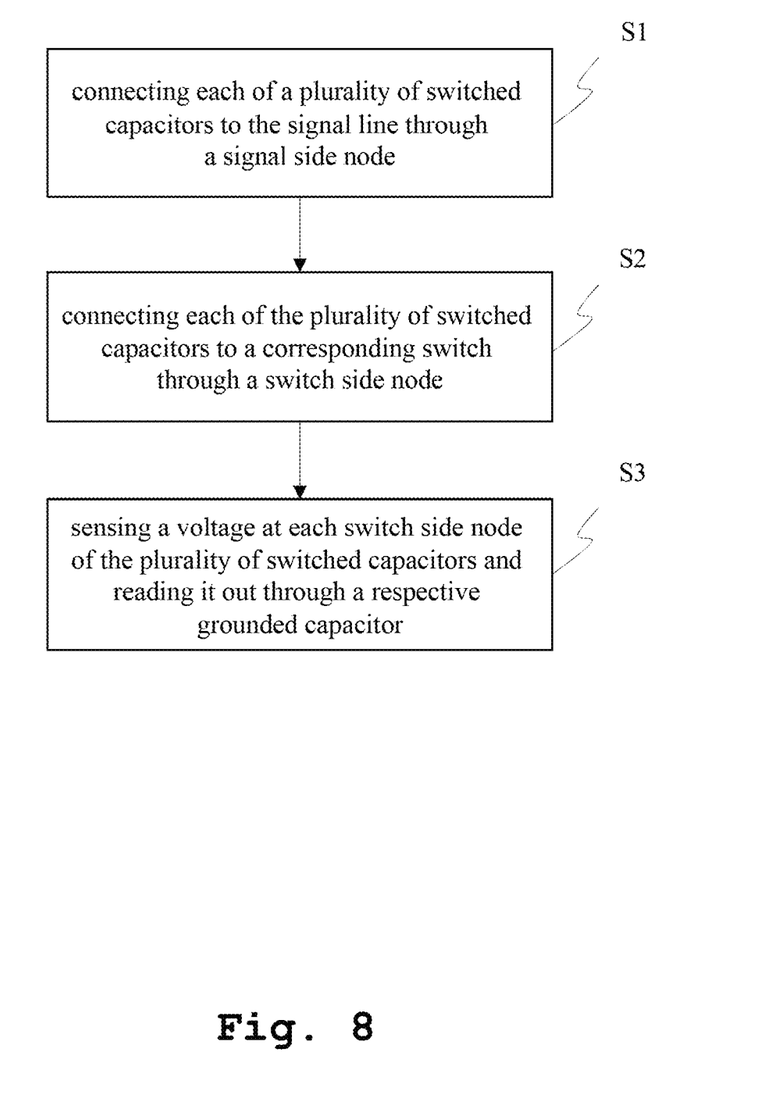
FIG. 8 shows a flow chart of an embodiment, according to an example of the second aspect.

FIG. 8 illustrates a flow chart of an example embodiment of the method according to the second aspect. In a first step S1, each of a plurality of switched capacitors is connected to the signal line through a signal side node. In a second step S2, each of the plurality of switched capacitors is connected to a corresponding switch through a switch side node. In a third step S3, a voltage at each switch side node of the plurality of switched capacitors is sensed and is read out through a respective grounded capacitor.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

The invention claimed is:

1. A radio frequency receiver comprising:
 a mixer circuitry to down-convert a received signal that is transported on a signal line to baseband signal components, wherein the mixer circuitry is arranged in a bottom plate configuration and further comprises:
 a plurality of switched capacitors, each of the plurality of switched capacitors is driven according to a respective clock phase and is connected to the signal line through a signal side node; and
 a switch side node connecting a corresponding switch to the signal side node such that a voltage detected at each switch side node of the plurality of switched capacitors and is read out through a respective grounded capacitor driven according to a second clock phase, wherein the second clock phase is different than the clock phase.

2. The radio frequency receiver according to claim 1, wherein the voltages at the switch side nodes of the plurality of switched capacitors correspond to baseband signal components.

3. The radio frequency receiver according to claim 2, wherein the mixer circuitry comprises:
 an even number of mixing paths, each comprising at least one of the plurality of switched capacitors.

4. The radio frequency receiver according to claim 3, wherein the mixer circuitry further comprises:
 a plurality of read-out switches coupled between each of the switch side nodes and the respective grounded capacitor.

5. The radio frequency receiver according to claim 4, further comprising:

clock generating circuitry configured to generate at least four-phase non- overlapping clocks to drive the plurality of switched capacitors and the plurality of read- out switches.

6. The radio frequency receiver according to claim 5, wherein the switched capacitors are driven in rotation such that at a given clock phase, at least two switched capacitors are out of phase to each other and are connected in series.

7. The radio frequency receiver according to claim 6, further comprising:
input circuitry configured to transform the received signal into a differential signal having a positive and a negative partial signal.

8. The radio frequency receiver according to claim 7, wherein the input circuitry further comprises an impedance matching network that corresponds to a low-loss LC network.

9. The radio frequency receiver according to claim 8, wherein the mixer circuitry further comprises:
a first terminal and a second terminal configured to receive the positive and the negative partial signal of the differential signal, respectively.

10. The radio frequency receiver according to claim 1, wherein the mixer circuitry further comprises:
bias switches configured to set a common-mode bias voltage of the mixer circuitry and a plurality of read-out switches through an external supply.

11. The radio frequency receiver according to claim 1, further comprising:
output circuitry coupled to the mixer circuitry configured to output the baseband signal components.

12. The radio frequency receiver according to claim 1, further comprising:
an antenna for receiving radio frequency signals.

13. A method for down-converting a received signal that is transported on a signal line to baseband signal components in a radio frequency receiver comprising mixer circuitry arranged in a bottom plate configuration, wherein the method comprises:
connecting each of a plurality of switched capacitors to the signal line through a signal side node, wherein each of the plurality of switched capacitors is driven according to a respective clock phase; and
connecting each of the plurality of switched capacitors to a corresponding switch through a switch side node;
sensing a voltage at each switch side node of the plurality of switched capacitors; and
reading out the sensed voltage through a respective grounded capacitor driven according to a second clock phase, wherein the second clock phase is different than the clock phase driving the corresponding switch associated with one of the plurality of switched capacitors.

14. The method according to claim 13, wherein the method further comprises:
arranging an even number of mixing paths, each comprising at least one of the plurality of switched capacitors.

15. The method according to claim 13, wherein the method further comprises:
driving the switched capacitors in rotation such that at a given clock phase at least two switched capacitors are out of phase to each other and are connected in series.

16. The radio frequency receiver according to claim 1, wherein the mixer circuitry comprises:
an even number of mixing paths, each comprising at least one of the plurality of switched capacitors.

17. The radio frequency receiver according to claim 1, wherein the mixer circuitry further comprises:
a plurality of read-out switches coupled between each of the switch side nodes and the respective grounded capacitor.

18. The radio frequency receiver according to claim 1, further comprising:
clock generating circuitry configured to generate at least four-phase non-overlapping clocks to drive the plurality of switched capacitors and a plurality of read-out switches.

19. The radio frequency receiver according to claim 1, further comprising:
input circuitry configured to transform the received signal into a differential signal having a positive and a negative partial signal.

20. The radio frequency receiver according to claim 19, wherein the mixer circuitry further comprises:
a first terminal and a second terminal configured to receive the positive and the negative partial signal of the differential signal, respectively.

* * * * *